United States Patent [19]
Oda

[11] Patent Number: 5,554,827
[45] Date of Patent: Sep. 10, 1996

[54] METHOD OF AND APPARATUS FOR DETERMINING WHETHER A DIGITIZER COORDINATE DETECTING TABLET IS PROPERLY OPERATING AND/OR WRITING ADJUSTMENT DATA INTO A MEMORY ASSOCIATED WITH THE TABLET

[75] Inventor: Yasuo Oda, Saitama-ken, Japan

[73] Assignee: WACOM Co., Ltd., Saitama-ken, Japan

[21] Appl. No.: 24,171

[22] Filed: Feb. 22, 1993

[51] Int. Cl.$^6$ ............... G08C 21/00; G09G 3/02
[52] U.S. Cl. ............... 178/18; 178/19; 345/173; 345/178; 345/179
[58] Field of Search ............... 178/18, 19, 20; 371/22.1, 25.1, 15.1; 345/173, 178, 179

[56] References Cited

U.S. PATENT DOCUMENTS

| | | | |
|---|---|---|---|
| 4,000,460 | 12/1976 | Kadakia | 235/153 |
| 4,650,926 | 3/1987 | Nakamura | 178/18 |
| 4,680,430 | 7/1987 | Yoshikawa et al. | 178/19 |
| 4,749,947 | 6/1988 | Gheewala | 371/15.1 |
| 4,758,690 | 7/1988 | Kimura | 178/19 |
| 4,791,357 | 12/1988 | Hyduke | 371/25.1 |
| 4,907,230 | 3/1990 | Heller | 371/22.1 |
| 4,959,805 | 9/1990 | Ohouchi et al. | 178/18 |
| 4,980,518 | 12/1990 | Kobayashi et al. | 178/18 |
| 5,107,541 | 4/1992 | Hilton | 178/18 |
| 5,202,624 | 4/1993 | Gheewala | 371/15.1 |
| 5,230,001 | 7/1993 | Chandra | 371/27 |

*Primary Examiner*—Stephen Chin
*Assistant Examiner*—Vijay Shankar
*Attorney, Agent, or Firm*—Lowe, Price, LeBlanc & Becker

[57] ABSTRACT

With a view to providing a coordinate detecting device whose operation can be checked after the housing thereof is assembled, check pin guide holes are provided in a portion of the housing, and check terminals are provided in a portion of a circuit board, the latter portion corresponding to that of the check pin guide holes, the check terminals being used for extracting signals input from and output to an external apparatus. The coordinate detecting device includes: a circuit board; a housing in which the circuit board is housed; and a cable extending from the circuit board to the outside of the housing, the cable being used to electrically connect the circuit board to the external apparatus. Storage elements for storing input data are provided. A covering label is attached to cover the check pin guide holes. The check pin guide holes and the check terminals are provided near a status lamp. The coordinate detecting device has advantages in that assembling steps can be reduced, and adjustment data which is characteristic of each apparatus can be written.

21 Claims, 6 Drawing Sheets

METHOD OF AND APPARATUS FOR DETERMINING WHETHER A DIGITIZER COORDINATE DETECTING TABLET IS PROPERLY OPERATING AND/OR WRITING ADJUSTMENT DATA INTO A MEMORY ASSOCIATED WITH THE TABLET

BACKGROUND OF THE INVENTION

1. Field of the Invention

The present invention relates to a coordinate detecting device for inputting coordinates to a computer operating as an external apparatus.

2. Description of the Related Art

In a conventional coordinate detecting device, as shown in FIG. 6, the operation of the coordinate detecting device is checked prior to factory shipment or during a repair in a condition in which the housing thereof is opened, an upper cover 71 is removed, and a circuit board 81 inside is exposed. In a coordinate detecting device having storage elements (e.g., ROMs) in which data used to adjust each apparatus (hereinafter referred to as "adjustment data") stored, the adjustment data are written at a time when the housing is open.

A coordinate detecting device 80 outputs to an external apparatus, such as a computer, the coordinates of a position pointed to by a position pointing device 80 as shown in FIG. 6. Whereas the position pointed to by the coordinate detecting device 80 is located on an effective area 73 on the surface of the housing when in use, that position becomes lower in a condition in which an upper cover 71 of the housing of the device 80 is removed. Therefore, it is necessary to place a plate 90 having a predetermined thickness (hereinafter referred to as a "height compensation plate") in order to check the operating state.

Therefore, in the past, the laborious task of placing the height compensation plate 90 must be performed after the housing is removed to write adjustment data or to check the operation of the device. The height compensated for by the height compensation plate 90 has been assumed to be the same for all of the manufactured devices, and variations from device to device ignored. However, in practice, there are variations in the height of each apparatus resulting from variations in the molded dimension of the housing or from variations in screwing during assembly.

SUMMARY OF THE INVENTION

The inventor of the present invention took such circumstance into consideration and thought it desirable to provide a coordinate detecting device whose operation can be checked and which is capable of writing adjustment data during a state in which the housing is assembled. This implies that the problems of the laborious task of removing the housing and of height compensation can be solved at the same time.

An object of the present invention is to provide a coordinate detecting device whose operation can be checked after the housing is assembled and to a method of operating same.

In order to achieve the above object, the present invention pertains to a coordinate detecting device comprising: a circuit board, a housing in which the circuit board is housed, and a cable extending from the circuit board to the outside of the housing, the cable being used to electrically connect the circuit board to an external apparatus, wherein check pin guide holes are provided in a portion of the housing, and check terminals are provided in a portion of the circuit board, corresponding to that of the check pin guide holes, the check terminals being used to extract signals derived from and supplied to the external apparatus.

Storage elements for storing data inputted from the check terminals may be provided on the circuit board. A covering label is preferably attached to cover the check pin guide holes. It is preferable that the check pin guide holes be provided near a status lamp.

The operation of the coordinate detecting device constructed as described above can be checked in its ordinary operating condition without opening/closing the housing. The provision of storage elements permits adjustments characteristic of each apparatus to be made. Because a label covers the check pin guide holes, the entry of dust or dirt can be largely prevented during ordinary use. Because of the covering label the user is not conscious of the check pin guide holes; the covering label increases the aesthetic appeal of the device. Because the check pin guide holes are located near a status lamp operation efficiency is increased when the operation of the coordinate detecting device is checked, to bring about an advantage in the design of the mechanism, and make the combined use of the covering label possible.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DESCRIPTION OF THE PREFERRED EMBODIMENT

A preferred embodiment of the present invention is described below with reference to the accompanying drawings.

Figure 1:
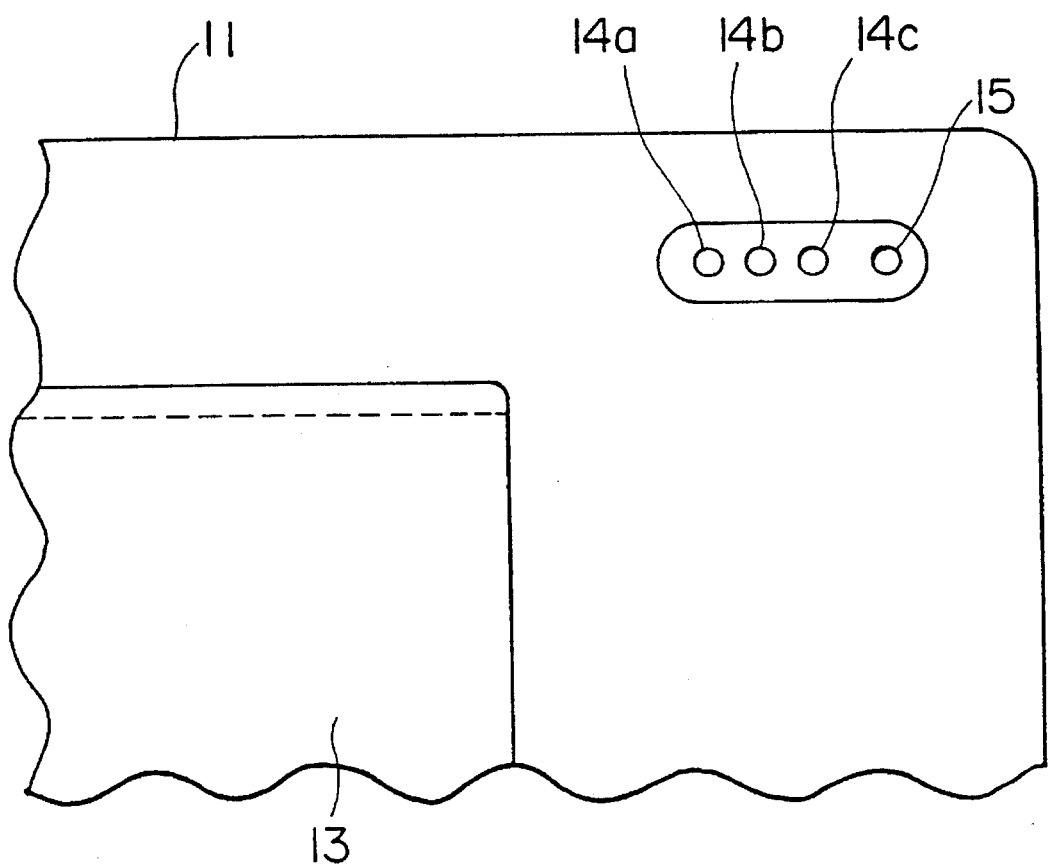
FIG. 1 is an enlarged view of a portion of an upper cover for a coordinate detecting device, wherein check pin guide holes in the corner are illustrated in detail.

FIG. 1 is an enlarged view of a portion of an upper cover 11 for housing 10 of a coordinate detecting device including the present invention, said portion including check pin guide holes 14a, 14b, 14c.

The coordinate detecting device referred to here is generally called a digitizer tablet. The basis of its method of detecting coordinates does not matter. Any coordinate detecting device having a circuit board and a housing in which the circuit board is housed may be applicable to the present invention regardless of whether it is based on an electromagnetic induction method, an electrostatic induction method, optical principles, or ultrasonic waves.

Since housing 10 of the coordinate detecting device is generally formed of upper cover 11 and a lower cover, an explanation will be given below on the assumption that the housing is formed of an upper cover and a lower cover. It goes without saying that the present invention can be embodied by providing check pin guide holes to be described below in a portion of the housing which serves as the obverse surface when the device is assembled, even if a housing having a construction other than the above is used.

The coordinate detecting device has a coordinate detection surface in a portion of the surface of an upper cover 11. Generally, there is an effective area 13 having ensured accuracy and resolution in the coordinate detection surface. Check pin guide holes 14a, 14b and 14c are provided in a portion other than the effective area 13 of the upper cover 11. That is, the holes 14a, 14b and 14c pass from the obverse surface of the upper cover 11 through the rear surface thereof. Also, a status lamp hole 15 passes from the obverse surface of the upper cover 11 through the rear surface thereof to permit light to pass.

Figure 2:
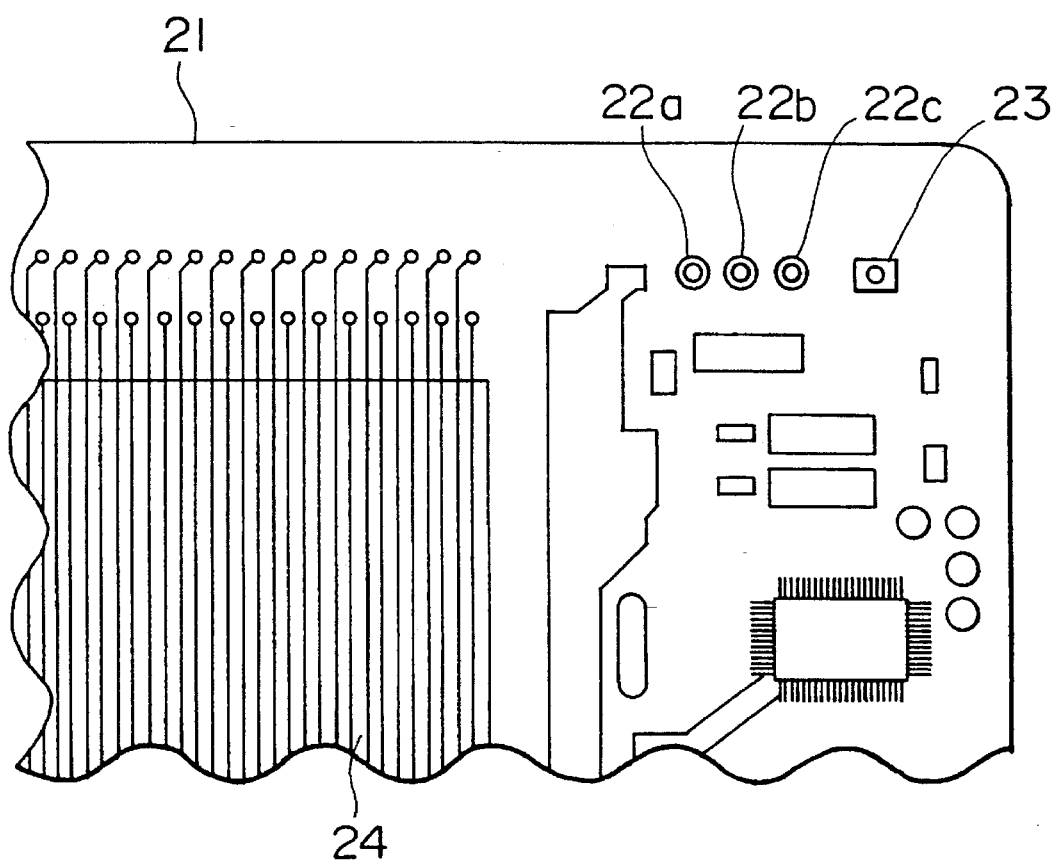
FIG. 2 is an illustration of a portion of a circuit board corresponding to that of the check pin guide holes.

FIG. 2 is an illustration of a portion of a circuit board 21 corresponding to that of the check pin guide holes 14a, 14b and 14c. Check terminals 22a, 22b and 22c are provided in a portion of the circuit board 21 corresponding to that of the check pin guide holes 14a, 14b and 14c, i.e. terminals 22a, 22b and 22c are respectively aligned with guide holes 14a, 14b and 14c. A status lamp 23 is provided in an area of the circuit board 21 corresponding to the status lamp hole 15, i.e. lamp 23 is aligned with hole 15. A sensor portion 24 is provided on an area of the circuit board 21 corresponding to that of the effective area 13. In FIG. 2, coordinate detection sensor portion 24 is an electromagnetic induction sensor. However, when a coordinate detection method other than the electromagnetic induction method is used, the sensor portion is constructed in other ways. Although an embodiment in which the sensor portion 24 and the circuit board having check terminals or the like are integrally formed by one circuit board is illustrated in FIG. 2, it is possible to form each of them by separate circuit boards.

Figure 3:
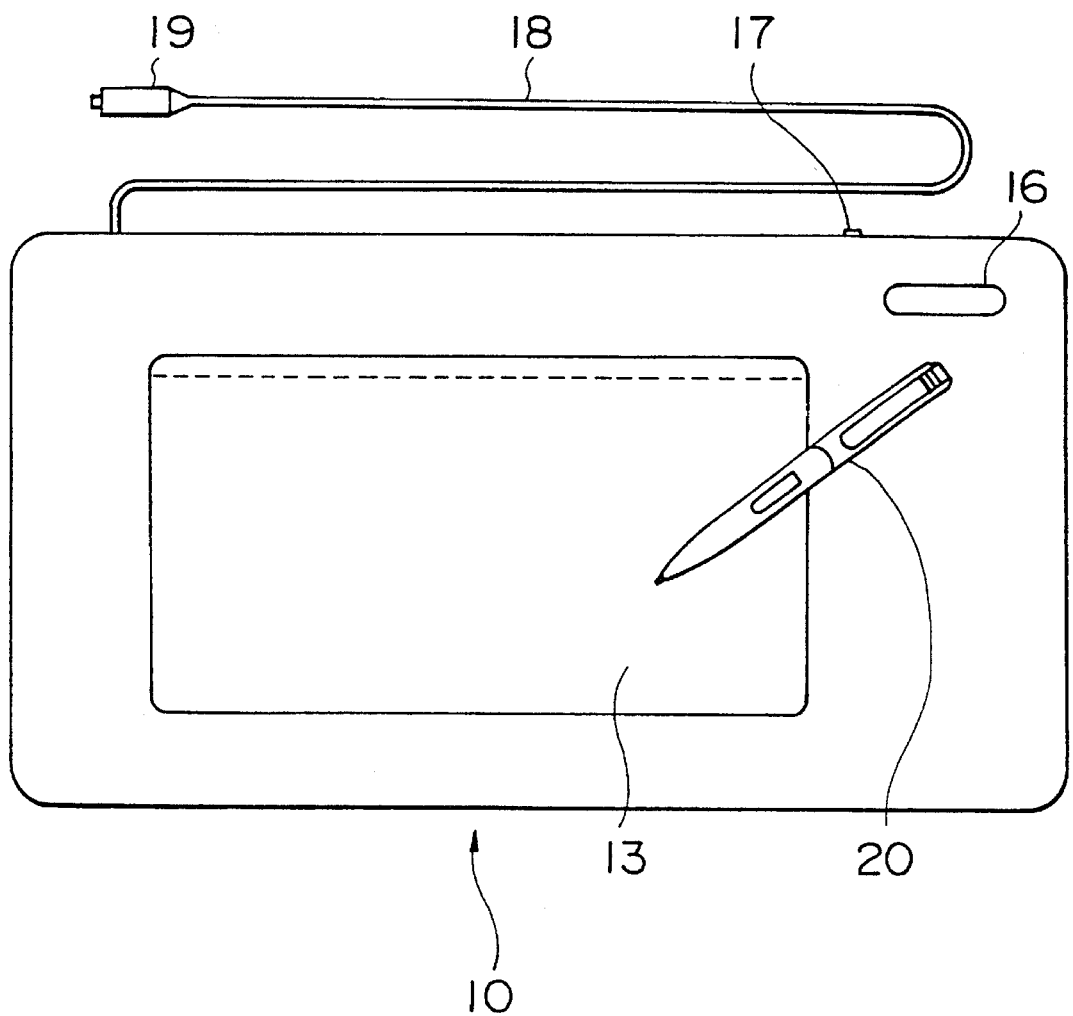
FIG. 3 is an illustration of an entire coordinate detecting device including the present invention.

The entire coordinate detecting device is illustrated in FIG. 3. As has already been stated, a coordinate detecting device in housing 10 of the present invention converts a position on the effective area 13 into coordinate values (e.g., XY coordinate values) when that position is pointed to by an operator using a position pointing device (pen) 20; the detecting device feeds signals representing the values on the position of pen 20 to an external apparatus. A cable 18 including connector 19 on the extreme end portion thereof, connects sensor 24 with the external apparatus. A power-supply switch 17 is provided at an appropriate portion on housing 10 (for convenience and clarity power-supply switch 17 is omitted from FIG. 1). The power-supply switch 17 is provided near status lamp 23 and hole 15 to facilitate the operator's confirmation of the operation of the status lamp.

Translucent label 16 covers holes 14a, 14b, 14c and 15 to permit light from status lamp 23 to pass and make check pin guide holes 14a, 14b and 14c in conspicuous when housing 10 is in use. For example, label 16 is made of a semi-transparent resin or the like. The operator need not peel the covering label 16 when the coordinate detecting device is in continuous use. The covering label 16 is attached by an adhesive or the like prior to factory shipment or when maintenance on the device is completed. The portion of the upper cover 11 is shown in FIG. 1 before covering label 16 is attached, the external appearance of housing 10 with the covering label 16 in situ is shown in FIG. 3.

Figure 4:
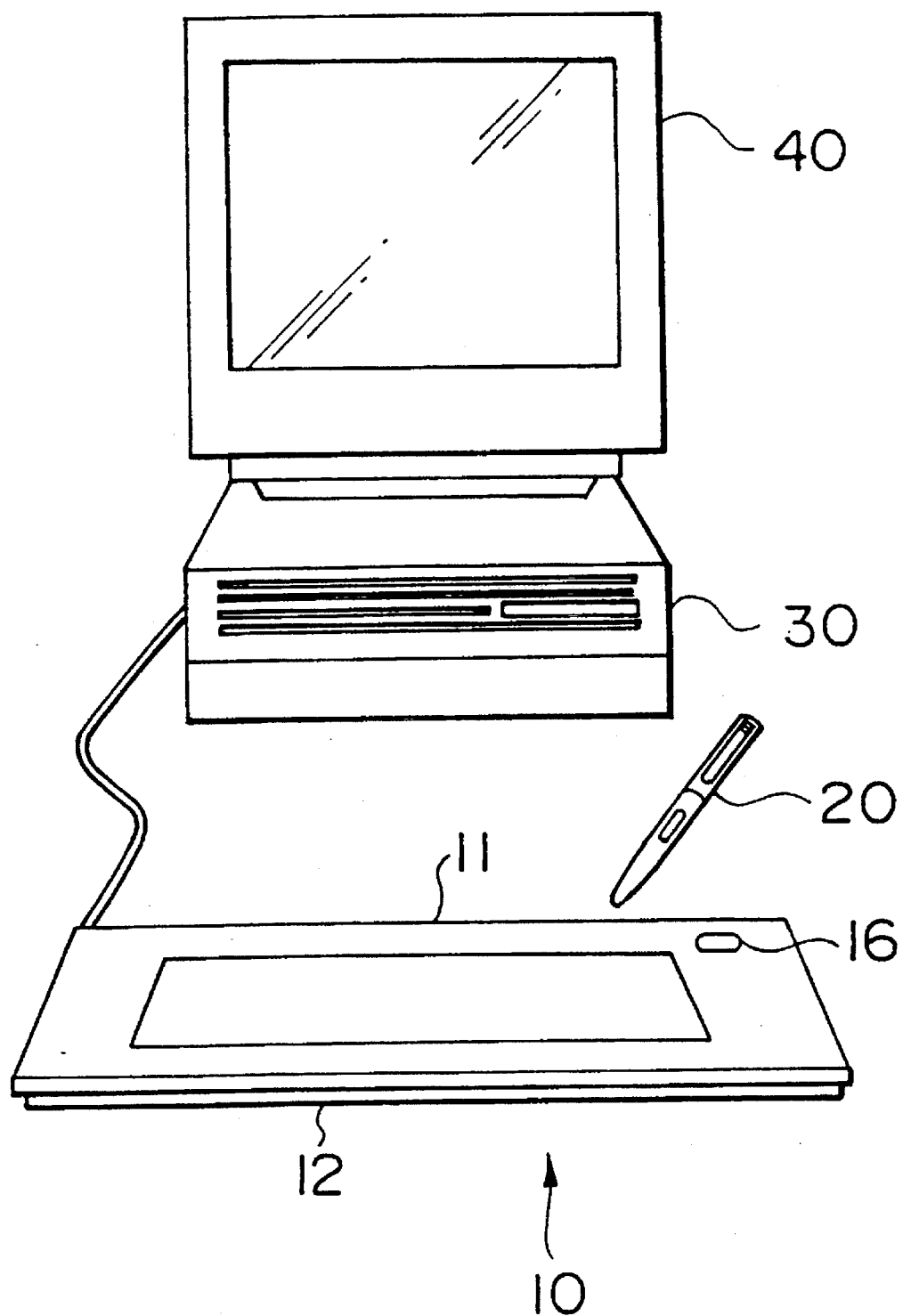
FIG. 4 is an illustration of the coordinate detecting device of FIG. 3, as connected to an external apparatus and then used.

FIG. 4 is an illustration of an example in which the coordinate detecting device in housing 10 is connected to an external apparatus and then used. In this example, the coordinate detecting device in housing 10 is used as an input device of the computer 30. The coordinate detecting device in housing 10 is connected to the computer 30 through a cable. The operator provides an input to the computer 30 as desired by pointing to a position on the coordinate detecting device 10 using the position pointing device 20, and confirms the results of the operation performed by the computer while watching a display device 40.

In this example, the coordinate detecting device in housing 10 supplies output signals, e.g. representing coordinate values of pen 20, to the computer 30. Also, various control signals from the computer 30 are supplied to the coordinate detecting device in housing 10.

Figure 5:
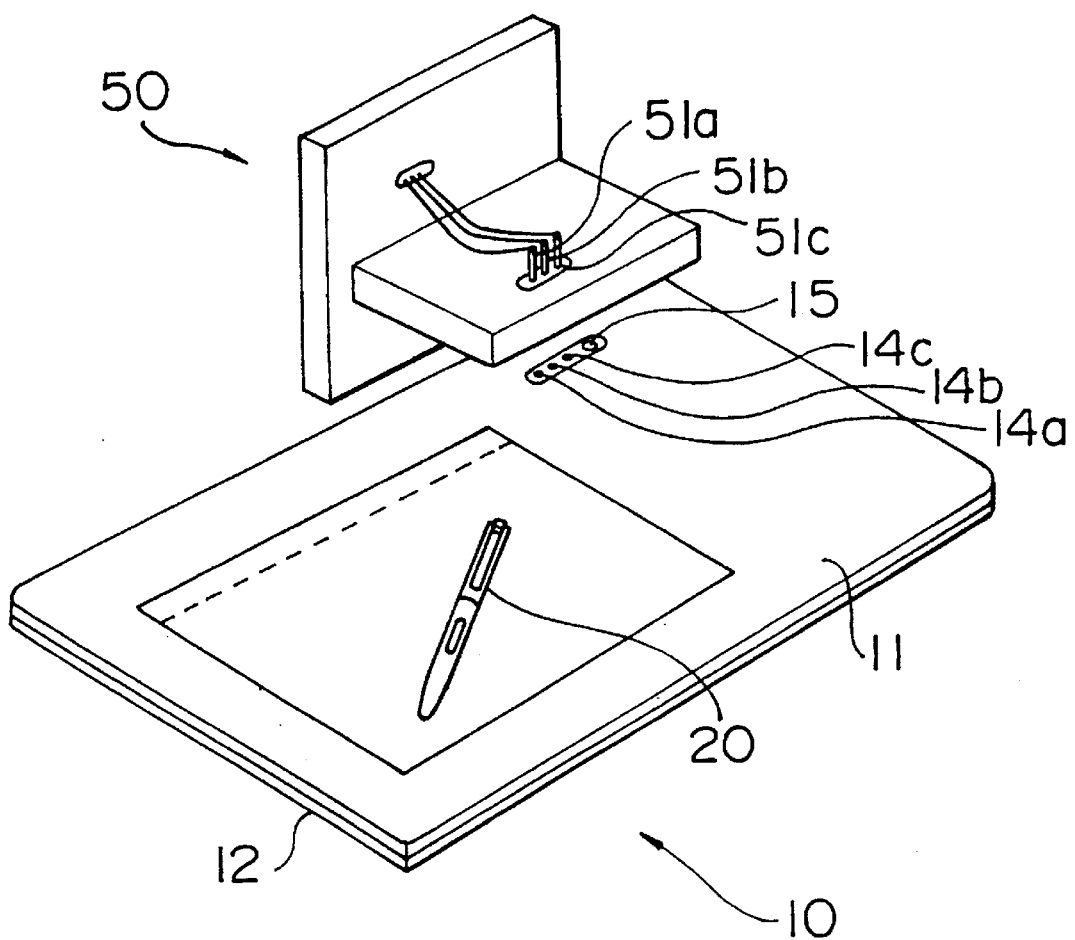
FIG. 5 is an illustration of a state in which the operation of the device illustrated in FIGS. 1–4 is checked or adjustment data are written.
Figure 6:
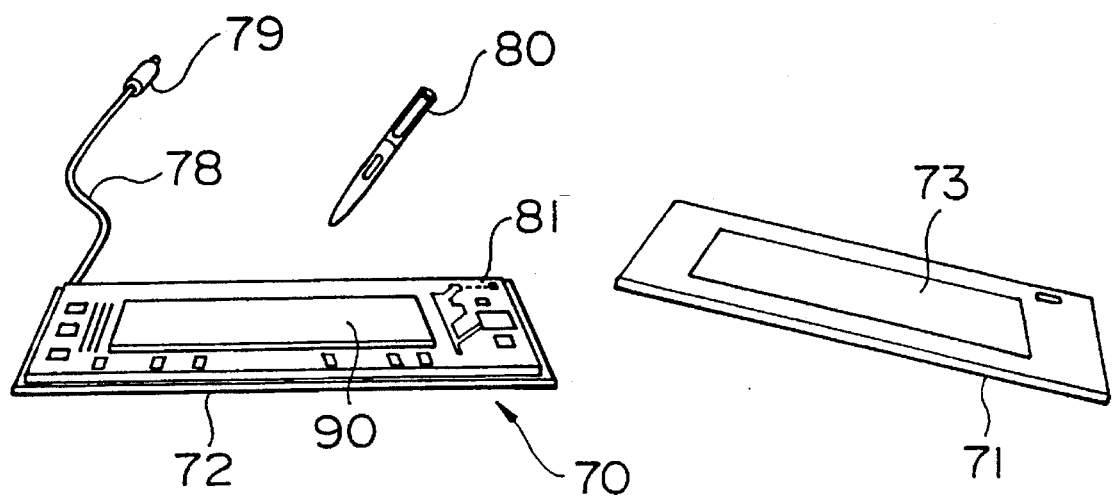
FIG. 6 is an illustration of a state in which adjustment data are written in a conventional coordinate detecting device.

FIG. 5 is an illustration of a state in which the operation of the coordinate detecting device in housing 10 is checked or adjustment data are written into a memory thereof. As mentioned earlier, this operation is performed during assembly of housing 10 prior to the shipment of products from the factory or during maintenance of the detector or other circuitry in the housing. A adjustment data writing apparatus 50 has check pins 51a, 51b and 51c which can be moved vertically. When the check pins 51a, 51b and 51c are inserted into the coordinate detecting device of housing 10, the check pins 51a, 51b and 51c are pass through the check pin guide holes 14a, 14b and 14c, respectively, and the leading edges thereof are brought into electrical contact with check terminals 22a, 22b and 22c of the circuit board 21. The check pins 51a, 51b and 51c are made vertically movable since the check pin guide holes 14a, 14b and 14c are provided on the top surface of the upper cover 11 so as to pass through the top surface vertically. In contrast, when the check pin guide holes are provided horizontally, the check pins 51a, 51b and 51c are moved horizontally. In this case, members each having an electrical contact surface corresponding to a horizontal movement are used for the check terminals 22a, 22b and 22c.

Check pins are provided as required; the number of pins corresponds to the number of check pin guide holes and the number of check terminals. Even though an example in which three check pins are provided is illustrated in the figures, the number of check terminals is not limited to this number. In a case where three check pins are provided, for example, a first check pin may be used to inform a control device provided on the circuit board 21 within the coordinate detecting device 10 of the fact that the operating state of the coordinate detecting device in housing 10 is being checked. A second check pin may be used to input coordinate value data derived from the coordinate detecting device in housing 10, and a third check pin may be used to write adjustment data.

The adjustment data pertain to the magnitude of detected signals and to data used to make an adjustment between a processor for coordinate calculation and a coordinate detecting device when, for example, a coordinate detecting device based on an electromagnetic induction method is used. It is preferable that this adjustment data be written in storage elements, such as ROMs, provided on the circuit board 21.

Since the present invention is constructed as described above, it has the advantages described below. Since check pin guide holes are provided on the housing and check pins are provided on a circuit board, the operation of the coordinate detecting device can be checked or adjustment data can be written after the housing is assembled or without disassembling the housing. As a result, assembly steps can be reduced, and the operation of the coordinate detecting device can be checked in a state closer to its ordinary operating state.

The provision of storage elements for storing adjustment data permits adjustments characteristic of each apparatus to be made. The attachment of a covering label prevents the entry of dust or dirt. At the same time, the covering label serves to make a user unconscious of the presence of the check pin guide holes and increases the aesthetic appeal of the device.

In addition, since the check pin guide holes are provided near a status lamp, they increase operation efficiency when the operation of the coordinate detecting device is checked. Since portions requiring holes having highly accurate dimensions are concentrated in a portion of the device, this brings about an advantage in the molding of the housing or the design of the mechanism. Furthermore, the covering label can be used both as a covering label for the status lamp hole and the check pin guide holes.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the claims. The following claims are to be accorded the broadest interpretation, so as to encompass all such modifications and equivalent structures and functions.

What is claimed is:

1. A coordinate detecting device, comprising:

a circuit board;

a housing in which the circuit board is housed; and a cable extending from the circuit board to outside of the housing for electrically connecting the circuit board to apparatus external to the housing, check pin guide holes located on a wall portion of the housing, and check terminals located on a portion of the circuit board, said circuit board portion corresponding to that of the check pin guide holes, said check terminals being connected for coupling signals between an apparatus outside of the housing and the circuit board.

2. A coordinate detecting device according to claim 1 wherein storage elements for storing data supplied to said check terminals are provided on said circuit board.

3. A coordinate detecting device according to claim 1 wherein a covering label is attached to cover said check pin guide holes.

4. A coordinate detecting device according to claim 1 wherein said check pin guide holes are located near a status lamp on the housing.

5. In combination, a housing, the housing including (a) an external wall having a plurality of openings, each sized so a check pin can pass through it, (b) a coordinate detecting device and a circuit board within the housing, the coordinate detecting device including a coordinate detection surface that has an accurate position for high resolution detection of an implement that can be moved relative to the surface, the circuit board having connections to the coordinate detecting device and a plurality of terminals, each terminal being arranged to receive one of the check pins and aligned with one of the openings, and a structure for coupling signals derived from and supplied to the detecting device between the circuit board and a device outside of the housing.

6. The combination of claim 5 wherein the circuit board carries a light source, the wall having a hole aligned with the light source so optical energy from the light source can propagate through the hole.

7. The combination of claim 6 wherein the openings and hole are located in proximity to each other and are covered by a translucent removable panel so optical energy from the light source can propagate through the hole and the panel, the pins being insertable through the openings into the terminals when the panel is removed.

8. The combination of claim 5 wherein the printed circuit board includes a memory storing data about the coordinate detection device, the memory being connected to at least one of the terminals so the data can be read from and written into the memory via the terminals and pins.

9. The combination of claim 5 wherein the coupling structure includes a cable for supplying signals indicative of the implement position as detected by the coordinate detection surface to the external device.

10. A method of (a) determining whether a digitizer coordinate detecting tablet is properly operating or (b) writing adjustment data into a memory associated with the digitizer coordinate detecting tablet, the digitizer coordinate detecting tablet including a circuit board with a coordinate detecting surface including an effective detecting area, an upper cover being superposed over the detecting surface while the digitizer coordinate detecting tablet is in normal use with a position pointing device, a portion of the upper cover other than the portion aligned with the effective area including a check pin guide hole, a portion of the circuit board other than the effective area including a check terminal aligned with the check pin guide hole, the method comprising positioning a position pointing device in operative relation with the effective detecting area while (1) the upper cover is superposed over the detecting surface in the same position as in normal use with the position pointing device so the pointing device is above the cover and (2) an electric connection is established between a check pin and the check terminal by inserting the check pin through the check pin guide hole so the check pin contacts the check terminal.

11. The method of claim 10 wherein a plurality of check pin guide holes and check pin terminals are provided in aligned relation with each other, the position pointing device being in operative relation with the effective detecting area while (1) the upper cover is superposed over the detecting surface in the same position as in normal use with the position pointing device and (2) electrical connections are established to more than one of the check terminals by inserting plural check pins through more than one check pin guide hole.

12. The method of claim 11 wherein a first of the check pins when connected to a first of the check terminals supplies a first signal to a control device on the circuit board that the operating state of the coordinate detecting tablet is being checked by an external device, a second of the check pins when connected to a second of the check terminals supplies to the external device a signal representing coordinate value data derived from the digitizer coordinate detecting tablet as a result of an interaction between the effective detecting area and the position pointing device, and a third of the check pins when connected to a third of the terminals supplies to a memory on the circuit board a signal representing adjustment data for correct read out during normal operation of the location of the position pointing device relative to the effective detecting area.

13. The method of claim 11 wherein one of the check pins when connected to one of the check terminals supplies a first signal to a control device on the circuit board that the operating state of the coordinate detecting tablet is being checked by an external device.

14. The method of claim 11 wherein a first of the check pins when connected to a first of the check terminals supplies a first signal to a control device on the circuit board that the operating state of the coordinate detecting tablet is being checked by an external device, a second of the check pins when connected to a second of the check terminals supplies to the external device a signal representing coordinate value data derived from the digitizer coordinate detecting tablet as a result of an interaction between the effective detecting area and the position pointing device.

15. The method of claim 11 wherein one of the check pins when connected to one of the check terminals supplies to the external device a signal representing coordinate value data derived from the tablet as a result of an interaction between the effective detecting area and the position pointing device.

16. The method of claim 11 wherein one of the check pins when connected to one of the terminals supplies to a memory on the circuit board a signal representing adjustment data for correct read out during normal operation of the location of the position pointing device relative to the effective detecting area.

17. The method of claim 11 wherein one of the check pins when connected to one of the check terminals supplies to the external device a signal representing coordinate value data derived from the digitizer coordinate detecting tablet as a result of an interaction between the effective detecting area and the position pointing device, and another of the check pins when connected to another of the terminals supplies to a memory on the circuit board a signal representing adjustment data for correct read out during normal operation of the location of the position pointing device relative to the effective detecting area.

18. The method of claim 10 wherein the check pin when connected to the check terminal supplies a signal to a control device on the circuit board that the operating state of the coordinate detecting tablet is being checked by an external device.

19. The method of claim 10 wherein the check pin when connected to the check terminal supplies a signal to a representing coordinate value data derived from the tablet as a result of an interaction between the effective detecting area and the position pointing device.

20. The method of claim 10 wherein the check pin when connected to the check terminal supplies a signal to a memory on the circuit board, the signal supplied to the circuit board representing adjustment data for correct read out during normal operation of the location of the position pointing device relative to the effective detecting area.

21. A method of (a) determining whether a digitizer coordinate detecting tablet is properly operating or (b) writing adjustment data into a memory associated with the digitizer coordinate detecting tablet, the digitizer coordinate detecting tablet including a circuit board with a coordinate detecting surface including an effective detecting area, an upper cover being superposed over the detecting surface while the digitizer coordinate detecting tablet is in normal use with a position pointing device, a portion of the circuit board other than the effective area including a check terminal, the method comprising positioning a position pointing device in operative relation with the effective detecting area while (1) the upper cover is superposed over the detecting surface in the same position as in normal use with the position pointing device so the pointing device is above the cover and (2) an electric connection is established between a check pin and the check terminal.

* * * * *